(12) United States Patent
Pehlke

(10) Patent No.: US 6,396,341 B1
(45) Date of Patent: May 28, 2002

(54) CLASS E DOHERTY AMPLIFIER TOPOLOGY FOR HIGH EFFICIENCY SIGNAL TRANSMITTERS

(75) Inventor: David R. Pehlke, Chapell Hill, NC (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/752,625

(22) Filed: Dec. 29, 2000

(51) Int. Cl.$^7$ .............................................. H03F 3/38
(52) U.S. Cl. ..................... 330/10; 330/207 A; 330/136; 330/251
(58) Field of Search ..................... 330/10, 136, 207 A, 330/251

(56) References Cited

U.S. PATENT DOCUMENTS

| | | | |
|---|---|---|---|
| 4,717,884 A | 1/1988 | Mitzlaff ........................ 330/251 |
| 5,329,259 A | 7/1994 | Stengel et al. ............... 332/103 |
| 5,467,055 A | 11/1995 | Wray et al. .................. 330/129 |
| 6,118,339 A | * 9/2000 | Gentzler et al. ............. 330/149 |
| 6,256,482 B1 | * 7/2001 | Raab ............................ 455/108 |
| 6,285,251 B1 | * 9/2001 | Dent et al. ................... 330/127 |
| 2001/0030581 A1 | * 10/2001 | Dent ............................. 330/297 |
| 2001/0050592 A1 | * 12/2001 | Wright et al. .................. 330/2 |

OTHER PUBLICATIONS

Cox, D. C. "Linear Amplification with Nonlinear Components". *IEEE Transactions on Communications*, Dec. 1974, np.

Sundström, L. et al. "Effect of Modulation Scheme on LINC Transmitter Power Efficiency". Electronics Letters Sep. 29th 1994, vol. 30, No. 20, pp. 1643–1645.

Bateman, Andrew et al. "Implementation of the LINC Transmitter Using the Combined Analogue Locked Loop Universal Modulator (CALLUM)". *Mobile and Personal Communications* Dec. 13–15, 1993, Conference Publication No. 387, pp. 31–37, ©IEE 1993.

Kahn, Leonard. "Single–Sideband Transmission by Envelope Elimination and Restoration". *Proceedings of the IRE*, Jan. 16, 1952, pp. 803–806.

Raab, Frederick H. "Intermodulation Distortion in Kahn–Technique Transmitter". *IEEE Transactions on Microwave Theory and Techniques*, vol. 44, No. 12, Dec. 1996, pp. 2273–2278; TP 3.6–1 to 3.6–10. ©IEEE 1998.

Hashjani, Tirdad Sowlati. "Class E Power Amplifiers for Wireless Communications". Thesis submitted for the degree Doctor of Philosophy, Dept. of Electrical and Computer Engineering, Univ. of Toronto, 1996. ©Tirdad Sowlati Hashjani, 1996.

Sokal, Nathan O. "Class E–A New Class of High–Efficiency Tuned Single–Ended Switching Power Amplifiers". *IEEE Journal of Solid–State Circuits*, vol. SC–10, No. 3, Jun. 1975, pp. 168–176.

(List continued on next page.)

Primary Examiner—Michael B Shingleton
(74) Attorney, Agent, or Firm—Coats & Bennett, P.L.L.C.

(57) ABSTRACT

A Doherty amplifier circuit is provided comprising a digital signal processor for producing separated amplitude and phase modulated waveforms, and a plurality of class E amplifiers in communication with the digital signal processor. Each of the amplifiers has an input for receiving signals corresponding to the waveforms, and outputs linked to a shared load network. In this way, a scheme for efficient amplification of amplitude modulated waveforms is achieved across a wide dynamic range and for a large peak-to-average ratio using only input modulated techniques.

24 Claims, 8 Drawing Sheets

OTHER PUBLICATIONS

Raab, Frederick H. "Idealized Operation of the Class E Tuned Power Amplifier". *IEEE Transactions on Circuits and Systems*, vol. CAS–24, No. 12, Dec. 1977. Submitted as an unpublished manuscript, revised Jul. 1977, pp. 727–735.

Zulinski, Robert E. et al. "Class E Power Amplifiers and Frequency Multipliers with Finite DC–Feed Inductance". *IEEE Transactions on Circuits and Systems*, vol. CAS–34, No. 9, Sep. 1987, pp. 1074–1087.

Raab, Frederick H. "Effects of Circuit Variations on the Class E Tuned Power Amplifier", *IEEE Journal of Solid–State Circuits*, vol. SC–13, No. 2, Apr. 1978, pp. 239–244f.

Vidkjaer, Jens. "A Computerized Study of the Class–C–Biased RF–Power Amplifier". *IEEE Journal of Solid–State Circuits*, vol. SC–13, No. 2, Apr. 1978, pp. 247ff.

\* cited by examiner

Theoretical peak efficiency of PA according to topology

US 6,396,341 B1

CLASS E DOHERTY AMPLIFIER TOPOLOGY FOR HIGH EFFICIENCY SIGNAL TRANSMITTERS

FIELD OF THE INVENTION

The present invention relates to power amplifiers. In particular, the present invention relates to efficient amplification of signals at a non-peaked average power level whose envelope is amplitude modulated, and specifically the application of linear amplification at RF frequencies of such signals up to high power levels.

BACKGROUND OF THE INVENTION

The requirements for higher data rates and bandwidth efficiency in wireless communication standards has caused designers to implement varying envelope modulation formats. The varying AM content of these formats allows for additional information to be transmitted in a given bandwidth. This varying envelope significantly constrains the ability of the power amplifier in a wireless device to linearly transmit the waveform. In addition, the varying envelope exhibits a "peak-to-average" ratio, where the average envelope power may be significantly below the peak envelope power. Ideally, the power amplifier would be capable of delivering peak power while operating at a much lower average power. Attempts at this, however, typically result in the application "backing-off" the power amplifier from peak in order to avoid clipping and distortion of the output waveform. This also results in an associated large decrease in efficiency from the peak. Moreover, the linearity of the power amplifier often requires that its output power be backed off even further than $P_{SAT}$ ((dBm)−PeakToAvgRatio (dB)) in order to satisfy further constraints in adjacent channel power rejection (ACPR) and error vector magnitude (EVM). At a minimum, the power amplifier must provide "headroom" for the output power to actually reach the peak output power and not saturate prematurely. It thus becomes critical for efficiency that the power amplifier topology be able to maintain efficiency at higher power levels.

One established technique for extending peak efficiency under "backed-off" power conditions is the "Doherty" amplifier, an example of which is shown in the schematic diagram of FIG. 1. The Doherty arrangement 2 utilizes two power amplifiers 4, 6 that saturate at different input power levels. This allows one amplifier to reach saturation and peak efficiency before the second. Because power amplifiers with higher output load impedances saturate at lower output power levels, the dynamic loading of the first power amplifier by a second amplifier can change the output power level at which it saturates and achieves peak efficiency. This characteristic allows it to behave in a saturated mode over a range of output power because its load impedance decreases along with increasing output power. This dynamic loading and the variation in output impedance over a range of output powers are achieved with a special power-combining load network 8.

In the typical exemplary implementation as shown, this output power combiner 8 utilizes a quarter-wave transformer 10 with characteristic impedance of 35.36 Ohms to transform from the load resistance of 50 to 25 at the output combiner node 8. A second quarter-wave transformer 12 with characteristic impedance of 50 Ohms transforms the output combiner node impedance to the impedance seen at the output of the carrier power amplifier 4. In order to correct for the phase difference between the paths of the two amplifiers 4, 6, a quarter-wave transmission line 14 is inserted at the input of the peaking amplifier 6, so that they sum coherently at their outputs. Initially, with the peaking amplifier 6 OFF, the load network 16 presents to the carrier power amplifier 4 in FIG. 1 a load impedance of $2*R_{OPT}=$ 100 Ohms, and the high impedance of the peaking power amplifier does not significantly load the output combiner node.

The higher impedance presented to the carrier power amplifier 4 forces it to saturate earlier to optimum load impedance. In the exemplary case, shown in FIG. 1, the $2*R_{OPT}$ load forces it to saturate 3 dB below peak. Once the peaking amplifier 6 activates, its finite output impedance starts to decrease the load impedance of the carrier power amplifier 4, until the point when both the carrier and peaking amplifiers 4, 6 deliver equal power into their own respective local load impedances of $R_{OPT}$=50 Ohms.

The effect of two power amplifiers delivering equally is that they provide 3 dB more output power than one alone, and given the 3 dB early saturation of the carrier amplifier 4, the pair 4, 6 provides a net 6 dB power range over which efficiency is maintained at nearly peak saturated efficiency. This power range is critical "headroom" required for the envelope variation to be faithfully recreated at the power amplifier output, while still maintaing peak saturated efficiency.

Previous implementations of the Doherty configuration have utilized a class B amplifier as the carrier amplifier, and a class C amplifier as the peaking amplifier as shown in FIG. 1. The class C peaking amplifier is used because of its unique property of only turning "ON" once a threshold input power is delivered to it. This characteristic makes it convenient to drive both power amplifiers and to use this threshold property to turn on the peaking amplifier at the point that the carrier amplifier saturates.

BRIEF SUMMARY OF THE INVENTION

Figure 1:
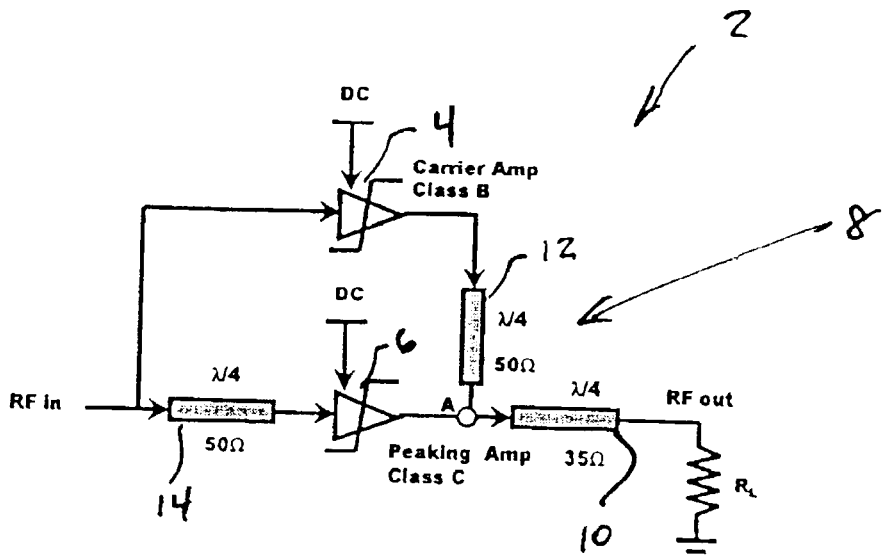
FIG. 1 is a schematic diagram of a prior art Doherty amplifier circuit that may be utilized in the present invention.

An alternative pair of carrier and peaking amplifiers for a Doherty arrangement is provided in accordance with the present invention in order to achieve significantly higher peak and average efficiencies. In particular, class E amplifiers are utilized, and input modulation approaches proposed by the inventor are implemented. These implementations are disclosed in U.S. application Ser. Nos. 09/752,052; 09/752, 415; and Ser. No. 09/752,417, incorporated herein by reference.

In one aspect of the present invention, a Doherty amplifier circuit is provided comprising a digital signal processor for producing separated amplitude and phase modulated waveforms, and a plurality of class E amplifiers in communication with the digital signal processor. Each of the amplifiers has an input for receiving signals corresponding to the waveforms, and outputs linked to a shared load network.

In another aspect of the present invention, an amplifier circuit is provided comprising a digital signal processor producing a plurality of digital amplitude modulation signals and at least one digital phase modulated signal, and a plurality of digital to analog converters in communication with the digital signal processor. The converters convert the digital amplitude modulation signals into analog amplitude modulation signals, and convert the digital phase modulated signal into an analog phase modulated signal. A plurality of class E amplifiers is provided in communication with the digital to analog converters to receive the analog signals. At least one of the amplifiers functions as a carrier amplifier connected to receive the analog phase modulated signal and one of the analog amplitude modulation signals. At least another of the amplifiers functions as a peaking amplifier connected to receive the analog phase modulated signal and another of the analog amplitude modulation signals.

The invention may also be embodied in a method of providing high-efficiency and high peak-to-average signal amplification. The method comprises the steps of providing first and second digital amplitude waveforms from a digital signal processor, and a first digital phase waveform from the digital signal processor. The first digital amplitude waveform is converted into a first analog amplitude waveform, and the second digital amplitude waveform is converted into a second analog amplitude waveform. The first digital phase waveform is then converted into a first analog phase waveform. A first output signal is generated by a carrier amplifier from the first analog amplitude waveform and the first analog phase waveform, and a second output signal is generated by a peaking amplifier from the second analog amplitude waveform and the second analog phase waveform. The first and second output signals are then combined.

Advantages of the present invention will become readily apparent to those skilled in the art from the following description of the preferred embodiments of the invention, which have been shown and described by way of illustration. As will be realized, the invention is capable of other and different embodiments, and its details are capable of modifications in various respects. Accordingly, the drawings and description are to be regarded as illustrative in nature, and not as restrictive.

DETAILED DESCRIPTION OF PREFERRED EMBODIMENTS

I. Input Modulation For Envelope Restoration In Class E Amplifiers

Figure 2:
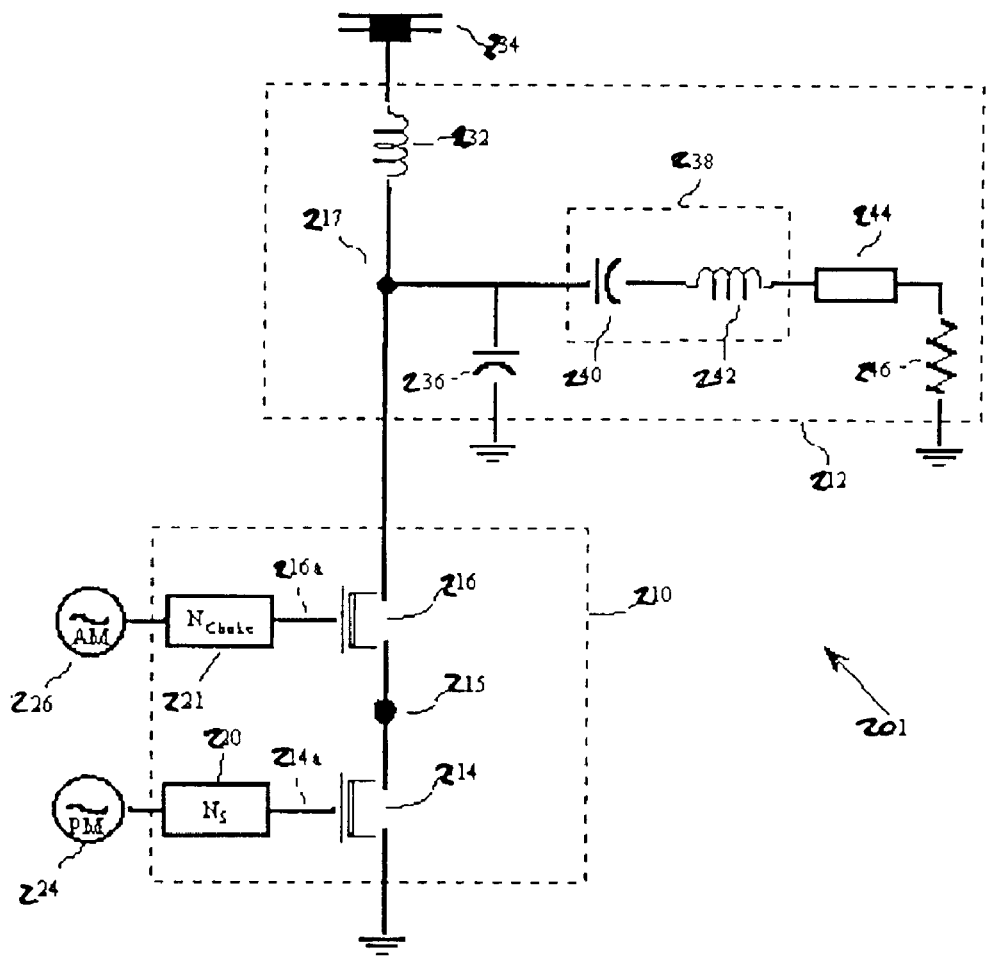
FIG. 2 is a schematic diagram illustrating an input modulation circuit for the load network of an amplifier as utilized in the present invention.

The various amplifier embodiments referred to above and disclosed herein involve the use of saturated class E amplifiers. The input to the amplifiers is modulated in various ways to vary the output power. Each of these approaches may be utilized here, but the TIMER input modulation scheme (Transmitter using input Modulation for Envelope Restoration) is used as an example throughout the preferred embodiment herein for purposes of continuity. The use of the TIMER scheme in the present embodiment involves utilizing a dual-gate FET device as the active switch component in a class E design as shown in FIG. 2. Generally, one switch is driven by the phase-only constant envelope information, and the other switch is used to modulate the output power envelope. The use of this second envelope terminal allows for the power amplifier to be turned ON independently of the drive level, affording more flexibility for Doherty-like schemes where the peaking amplifier is typically turned on based on the input drive power level.

Turning now to the drawings, wherein like numerals designate like components, FIG. 2 is a diagram of an active device switching circuit 210 combined with an output load matching network 212 to make up a class E amplifier 201. The circuit 210 preferably includes a pair of switching devices 214 and 216, each of which may be independently controlled to exhibit different resistances to the total current flowing through the pair. The switching devices should be lower minimum "ON" resistance devices with high-speed switching capabilities, one example would be the MwT-5 Dual-gate FET (reference http://www.mwtinc.com/cat/fets/htm/new-htm/MwT-5_1.htm) manufactured by MwT, Inc. These devices are exemplary only for this embodiment, and a wide variety of other components or structures may be substituted for the components described in accordance with the knowledge of one skilled in the art.

The switching devices 214, 216 are linked in series or "cascode" as shown connected to the output load matching network 212 at node 217. The gates 214a and 216a of each of the transistors 214 and 216 receive phase information 224 and amplitude information 226, respectively, from a primary waveform. The received information 224 and 226 into the gates 214a and 216a of the transistors 214 and 216 is utilized to vary the switching resistance of the transistors in accordance with the input primary waveform to create a secondary waveform at node 217.

The implemented standard class E amplifier comprises a single transistor switch and an output load matching network 212. The connection node 217 between the active switch devices 210 and this standard class E output load matching network 212 comprises an inductance coil 232 connecting to the supply voltage Vdd 234. A capacitance 236 which includes parasitic capacitance from the active device(s) in parallel with the active device output impedance. A tuned circuit filter 238 consisting of a capacitance 240 and an inductance 242 is connected in series with a reactive component 244 and a load resistance 246, nominally 50 Ohms. Typically, frequency and phase modulation information is received from the switches at node 217, and amplitude modulation information is received by variation of the supply voltage Vdd at 234. However, in the present case, as will be described below, the phase and amplitude information 224 and 226 are both received as a switched input at 214a and 216a and the input terminals are used to combine phase and amplitude information to a desired signal at node 217, such that the final signal delivered to the load 246 is as desired.

A matching network 220 is linked to input gate 214a of the active switching device 214 to provide optimum power transfer from the phase modulated source to the switching device 214. The matching network 220 may comprise a number of reactive elements according to known methods. Another matching network 221 is linked to the input gate 216b of the active switching device 216 to block any phase information from reaching the amplitude modulated source, while still providing a low frequency path from the amplitude modulated source to the switching device 216. This second matching network also may comprise a combination of reactive elements according to known methods.

During operation, the active switching device 214 is gated on and off through the gate 214a in accordance with the received phase information 224. Similarly, the switching device 216 is gated on and off via the input 216a in accordance with envelope information 226 received at the gate. Given that one switch switches at an RF frequency between an entirely off state to an entirely on state, the output across the load 46 of the matching network 212 of the amplifier 201 is determined by the total "ON" resistance of the pair of switching devices 214 and 216. The output can be modulated by the switch having the higher "ON" resistance. In the present case, switch 216 can thus be driven with a low frequency signal so that the "ON" resistance of the switch 216 produces a flexibly adjusted output amplitude and thus restores the output envelope amplitude. The second switch 216 is continuously variable and allows for a smoothly continuous change in the "ON" resistance, and an associated continuous change in the output envelope amplitude.

The switching device 216 slowly varies the envelope information. The function of this information in the switch configuration of the circuit 210 is to provide additional isolation of the RF feedthrough between the high-speed switching of the phase information input and the node connected to the load network. The switching device 214 receives a high-frequency input and has a direct source connection to the load-inductance ground for enhanced stability. The node 215 between the switches 214 and 216 traces the output node connected to the load network, thereby causing the switch 216 to switch on and off at the same frequency as the lower switch. The switching device 214 receives a high-frequency input and has a direct source connection to low inductance ground for enhanced stability. Preferably, the switches are capable of switching at high frequencies so that maximum gain and efficiency may be attained from this cascode configuration.

The present switching circuit 210 advantageously allows a single RF input into the matching network 212 and a second low-frequency baseband envelope input to achieve the variable "ON" resistance necessary for input into the matching network 212. This reduces the necessity for multiple RF inputs and associated high-frequency signal lines on valuable circuit board real estate. Furthermore, the requirement for multiple matching networks or multiplexing functions preceding the actual matching network 212 are not required.

Figure 3:
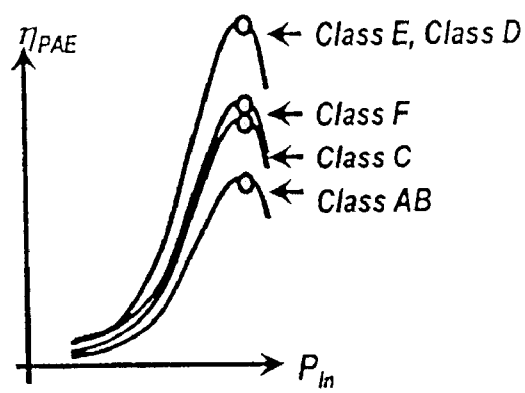
FIG. 3 is a graphical representation of the theoretical peak efficiencies of various power amplifiers according to their class topology.

In class E devices, the peak efficiency is much higher than the class C configuration, theoretically 100% vs. 85% (for 73.5° conduction angle in class C case) as diagrammed in FIG. 3. Realistically achievable efficiencies at RF frequencies for class E vs. class C devices are upwards of 80% vs. 65% respectively. One shortcoming of the TIMER scheme is that for modulation formats requiring envelope variation, the average efficiency falls off as a function of the output power back off required. In simulation environments, a 3 dB peak-to-average ratio results in a peak efficiency of greater than 80%, but average efficiency at roughly 50%. This roll-off in efficiency results because of the loss inherent in the increased switching ON resistance of the active device that is the basis for the modulation of the output envelope.

II. The Doherty Concept Including Input Modulation Class E Topologies

Figure 4:
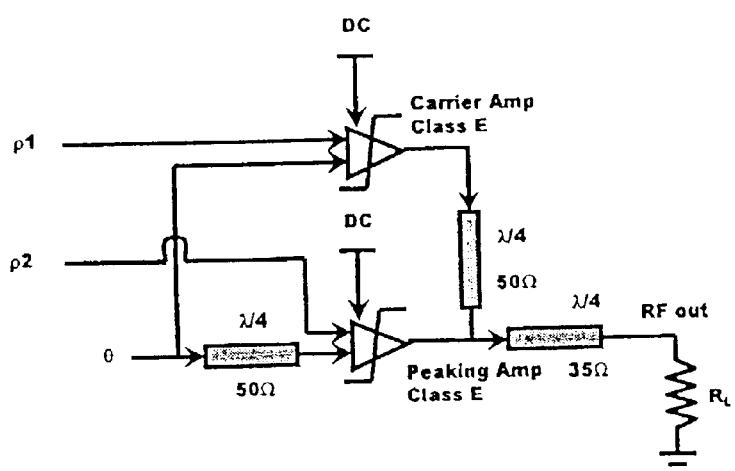
FIG. 4 is a schematic diagram of a Doherty amplifier configuration of the present invention in a first embodiment.

A first implementation of the present invention having a Doherty scheme using the TIMER input modulation of class E amplifiers is shown in FIG. 4. The two amplifiers are both driven by a phase-only constant envelope signal, and the separate envelope modulation inputs are used to stagger the output powers of the carrier and peaking amplifiers to result in an extended peak efficiency range. As the carrier amplifier reaches saturation at peak power and efficiency with the peaking amplifier off, the peaking amplifier is turned on and the efficiency range is extended to the point where both amplifiers deliver their peak output powers equally, and the maximum combined output power is reached.

Figure 5:
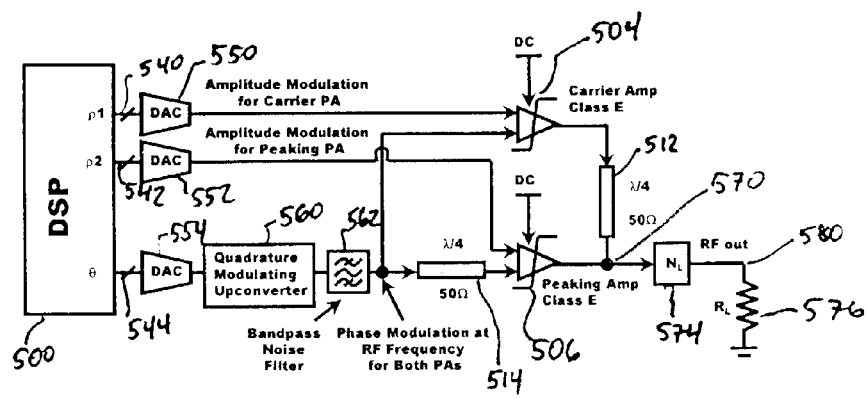
FIG. 5 is a schematic diagram of a second embodiment of the Doherty amplifier in accordance with the present invention.
Figure 6:
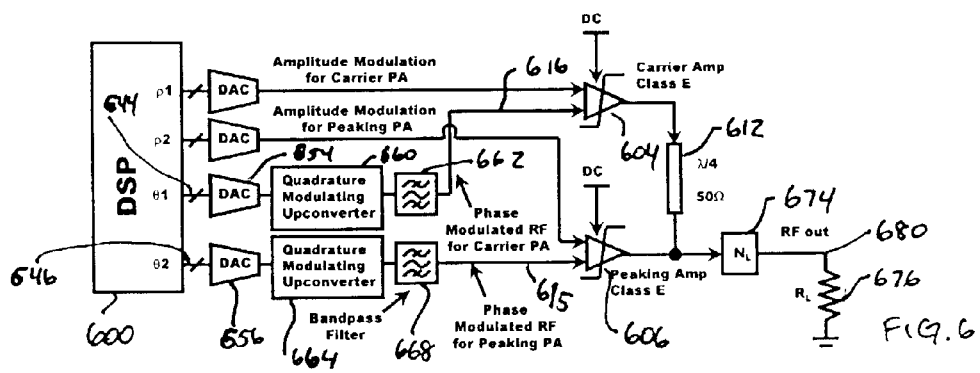
FIG. 6 is a third embodiment of the Doherty amplifier in accordance with the present invention.

More detailed implementations of the invention including illustration of the generation the separate modulated waveforms in accordance with the present invention are shown in FIGS. 5 and 6. As shown in FIG. 5, the system block diagram of a class E Doherty amplifier of the present invention includes a baseband digital signal processor 500 connected to input a modulated waveform to link to carrier amplifier 504 and a peaking amplifier 506. The amplifiers 504 and 506 are class E amplifiers as illustrated and described above. The digital signal processor 500 generates the separated amplitude and phase waveforms via outputs 540, 542, and 544, completely controls the delay that is introduced between the phase and amplitude signal paths. The outputs 540 and 542 output an amplitude modulated signal for the carrier and the peaking power amplifiers 504 and 506, respectively. High bit-rate digital to analog converters 550 and 552 are connected to the outputs 540 and 542, respectively, to convert the digital signals from the DSP 500 to analog signals before connection to the amplifiers 504 and 506.

The output 544 of the DSP 500 produces a shared phase-modulated waveform at the RF frequency for input into both of the amplifiers 604 and 506. The output 544 inputs the digital signal from the DSP 500 to a high bit-rate digital to analog converter 554 for conversion of the signal to analog format. The converter 554 is in turn linked to a quadrature-modulating upconverter 560 and a bandpass noise filter 562 if required. A filter is not required for the baseband amplitude modulated signals.

The output of the bandpass noise filter 562 is input directly into the class E carrier amplifier 504. A 50-ohm quarter-wave transformer 514 is linked between the bandpass filter 562 if required and its shared input into the peaking amplifier 506. The output of the carrier amplifier 504 is linked to another quarter wave, 50 ohm, line transformer 512 before being combined with the direct output of the peaking amplifier 506 at the node 570. The node 570 is in turn linked to a matching load network 574 and a load resistance 576 at the output 580.

One advantage of the architecture of FIG. 5 is that only a single filter for the shared phase modulated RF signal is required for suppression of out-of-band noise, as the amplitude modulated baseband signals do not require filtering. The digital signal processor (DSP) is used to generate all three required signals, and high bit-rate digital-to-analog converters (DAC) are used to output high-resolution analog signals for the power amplifier inputs.

In an alternative implementation that allows for the removal of the one-quarter wave transmission line at the peaking amplifier input and a reduction in the area of the total solution, FIG. 6 diagrams the use of separate phase modulated RF paths. The relative phase between them is adjusted by the DSP 600, which provides for the required 90° differential in the resulting outputs of the carrier and peaking amplifiers. In this alternative system, the quarter-wave transformer line 514 shown in FIG. 5 is eliminated. Instead, a second phase-modulated waveform output 646 is provided at the digital signal processor 600. The output 646 is in turn linked to a high bit-rate digital to analog converter 656. The output of the converter 656 is in turn linked to a separate quadrature modulating upconverter 664 and a bandpass filter 668 if required. The output of the filter 668 is linked at 615 directly to the peaking amplifier 606 and is not shared with the carrier amplifier 604. The carrier amplifier 604 instead receives the direct phase-modulated waveform output from the separate quadrature modulating upconverter 660 and the bandpass filter 662 if required via the output link 616 as shown.

The present embodiment utilizes two separate upconverter paths to generate separate phase-modulated RF signal inputs to the carrier and peaking amplifiers 604 and 606. In this embodiment, the quarter-wave line is eliminated at the input 615 of the peaking amplifier 606, and the control of the phase matching between the two amplifiers is taken over by the DSP 600.

An additional extension of this concept is to size the amplifiers differently and to design the quarter-wave transmission lines differently such that a wider dynamic range is achieved. By sizing the carrier amplifier to be smaller than the peaking amplifier, the lowest peak in efficiency will occur at a much lower power level and may be optimized for the specifics of a given communication system. As the ability of the carrier and peaking amplifier to deliver the same peak power becomes limited by this, the efficiency at power levels between the cases when the carrier amplifier 504 operates alone, and the case where the carrier amplifier 504 and peaking amplifier 506 are operating together will suffer a larger dip in efficiency as a function of total output power. This application of Doherty power combining of differently sized carrier and peaking amplifiers will sacrifice peak efficiency and output power, but offers a flexible approach to achieving peak efficiency at a power level significantly below the 6 dB back-off of conventional Doherty implementations. Some mitigation of the peak efficiency and peak total output power limitations can be achieved by optimal sizing of the quarter-wave transmission lines, in order to optimize the power levels for which unequal impedances are presented to the combination of amplifiers.

The additional signal path adds some complexity to the system due to the addition of a filter, power consumption by the separate upconverter, and the requirement for gain and delay matching between the two paths. Thus, there is a minor trade-off that needs to be managed with the system power and area used. Overall, however, the solutions suggested provide a novel architecture that is cast specifically for input modulated class E amplifier cores, but is suitable and intended to be applicable for all carrier/peaking amplifiers. Simulations of this configuration show the drain efficiency being maintained at greater than 70% over 6 dB of back-off from peak output power.

III. Predistortion Options

Figure 7:
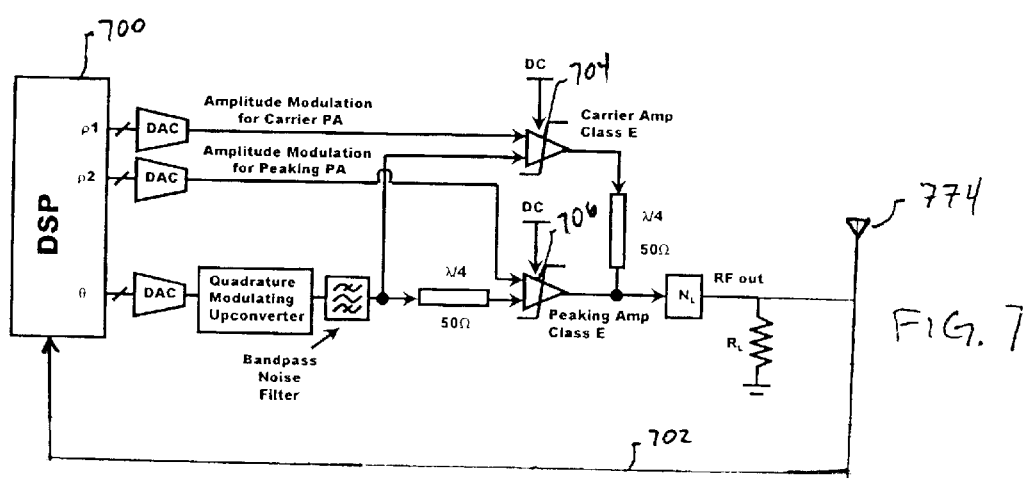
FIG. 7 is a fourth embodiment of the Doherty amplifier in accordance with the present invention implementing a feedback loop as an alternate configuration.

As with the standard Doherty configuration, some amplitude and phase predistortion may be required so that the envelope modulation on the input translates to the desired output envelope. This implementation is shown in FIG. 7, wherein the phase is adjusted so that the AM/PM can be compensated. In particular, a unique input waveform for any given desired output may be defined so that a baseband digital signal processor can properly generate the corrected input waveform. This predistortion methodology is well-known in the art. In the alternative, an additional feedback loop may be implemented to periodically update the input-to-output relationship in accordance with any long-term degradation requirements. For example, a feedback loop 702 may be used to sense any voltage standing wave ratio ("VSWR") reflection from the antenna 774. The feedback loop may then control the digital signal processor 700 to adjust the amplitude information to correct for any VSWR reflection before the amplitude information is received by the amplifiers 704 and 706. With this predistortion in place, the linearity of the amplifier module can be achieved with extremely high efficiency.

Several aspects differentiate this implementation from standard Doherty amplifiers using class C and class B amplifiers. For example, the separation in a class E amplifier of the RF constant envelope phase information from the lower frequency envelope modulation at the input allows for the second power amplifier to be turned on by the envelope modulation terminal, and not by the drive level of a combined I/Q modulated RF signal only.

In addition, the peak efficiency is much higher for the class E implementation, allowing the use of extremely high efficiency, constant envelope modulation within the same power amplifier module. Moreover, the use of fixed DC voltage steps down from the battery voltage allows for the same efficiency performance down to extremely low voltages. These voltages are even lower than for standard Doherty implementations using class B or C amplifiers. Finally, distinctive advantages are possible through the use of class E amplifiers. These amplifiers allow for minimum die dimension and the smallest single stage power amplifier of all classes of amplifiers. The potential for stable use of ultra-small gate dimension FET's is not possible with other amplifier topologies.

The efficiency at lower output power levels for this configuration is governed by the carrier amplifier alone as the peaking amplifier is turned off. This efficiency, however, will be better than for a single class E amplifier sized for the peak output power, because the carrier amplifier is designed to saturate at 3 dB below the peak output power of the Doherty module. This results in a shift of the entire efficiency curve down in power by 3 dB and a net higher efficiency at all power levels.

IV. Other Implementations

The present invention may also be implemented in alternative configurations. Most importantly, other input modulation schemes may be utilized with implementations of the present invention, either substituted for or used in addition to the TIMER scheme illustrated herein.

A. Active Switch Input Modulation

Figure 8:
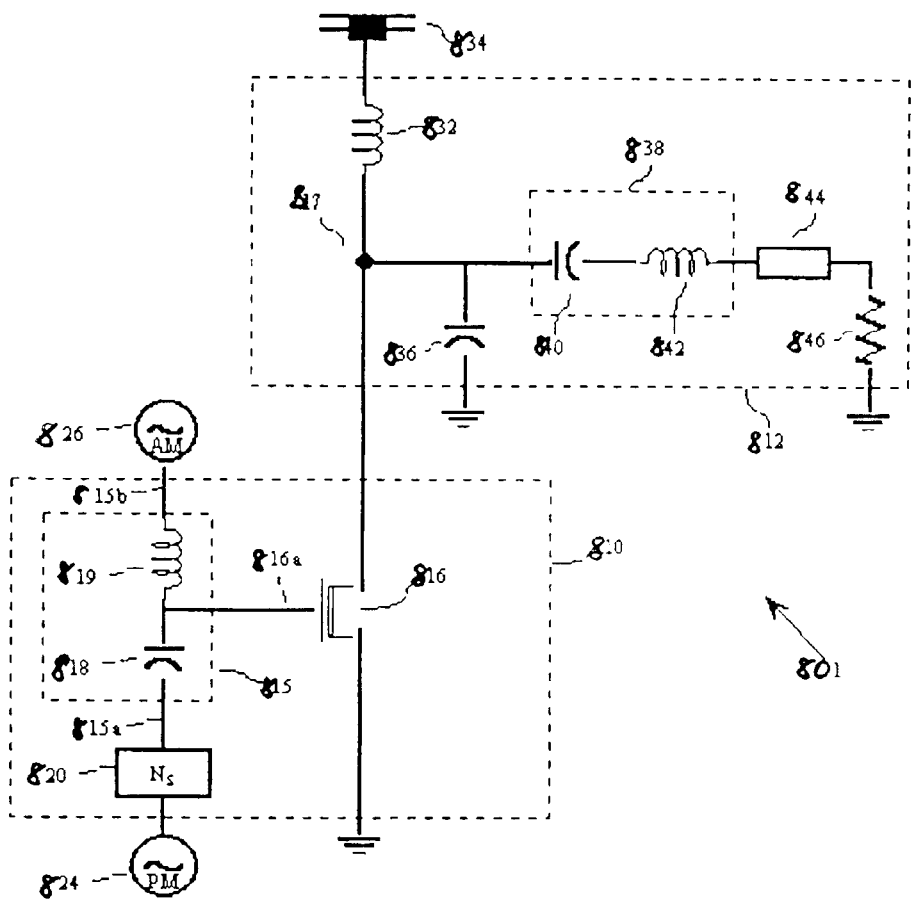
FIG. 8 is a schematic diagram of an alternative active switching circuit for providing a switched waveform input to standard class E output load matching network.

For example, FIG. 8 shows a diagram of a active device switching circuit 810 combined with an output load matching network 812 to make up an amplifier 801. The circuit 810 preferably includes a single switching device 816 linked to a tuned filter 815. The switching device 816 should be a lower minimum "ON" resistance device with high-speed switching capabilities, one example would be the 2SK2922 LDMOS RF discrete FET transistor manufactured by Hitachi, Inc. (http://www.hitachi.co.jp/Sicd/English/Products/transise.htm). These devices are exemplary only for this embodiment, and a wide variety of other components or structures may be substituted for the components described in accordance with the knowledge of one skilled in the art. The filter 815 preferably includes a capacitance 818 and an RF choke coil 819 linked in series and through their central connection node to the gated input 816a to the switching device 816. These devices are exemplary only, and a wide variety of other components or structures may be substituted for the components described in accordance with the knowledge of one skilled in the art.

The filter 815 utilizes the capacitance 818 and the RF choke 819 for summation of the combined DC envelope and RF phase waveforms. Using this preferred configuration to combining the waveforms, the variation in "ON" voltage is small and the "ON" resistance can in turn be controlled with a minimum of distortion.

The switching device 816 is in turn linked as shown to the load network input 817 of the amplifier 812. The gate 816a of the switching device 816 receives a combined input of phase information 824 and amplitude information 826 that are input into the filter 815 through inputs 815a and 815b, respectively, from a primary waveform. A matching network 820 is linked to input 815a to provide optimum power transfer from the phase modulated source through the tuned filter to the input gate 816a of the switching device 816. The matching network 820 may comprise a number of reactive elements according to known methods. The received information 824 and 826 is utilized to vary the switching resistance of the switching device 816 in accordance with the input primary waveform to create a secondary waveform for the amplifier input 817.

During operation, the active switching device 816 is gated on and off through the gate 816a in accordance with the combined received phase and amplitude information 824 and 826. Given that the device 816 switches at an RF frequency between an entirely off state to an entirely on state, the output across the load resistance 846 of the matching network 812 is determined by the modulated "ON" resistance of the switching device 816. The switch 816 can thus be driven with a low frequency signal so that the "ON" resistance of the switch 816 produces a flexibly adjusted output amplitude and thus restores the output envelope amplitude.

The switching device 816 slowly varies the envelope information. The function of this information in the switch configuration of the circuit 810 provides additional isolation of the RF feedthrough between the high-speed switching of the phase information input and the node connected to the load network.

The present switching circuit 810 advantageously allows a single RF input into the matching network 812 and a low-frequency baseband envelope input to achieve the variable "ON" resistance necessary for input into the matching network 812. This reduces the necessity for multiple RF inputs and associated high-frequency signal lines on valuable circuit board real estate. Furthermore, the requirement for multiple matching networks or multiplexing functions preceding the actual matching network 812 are not required.

B. Multiplexed Input Modulation

Figure 9:
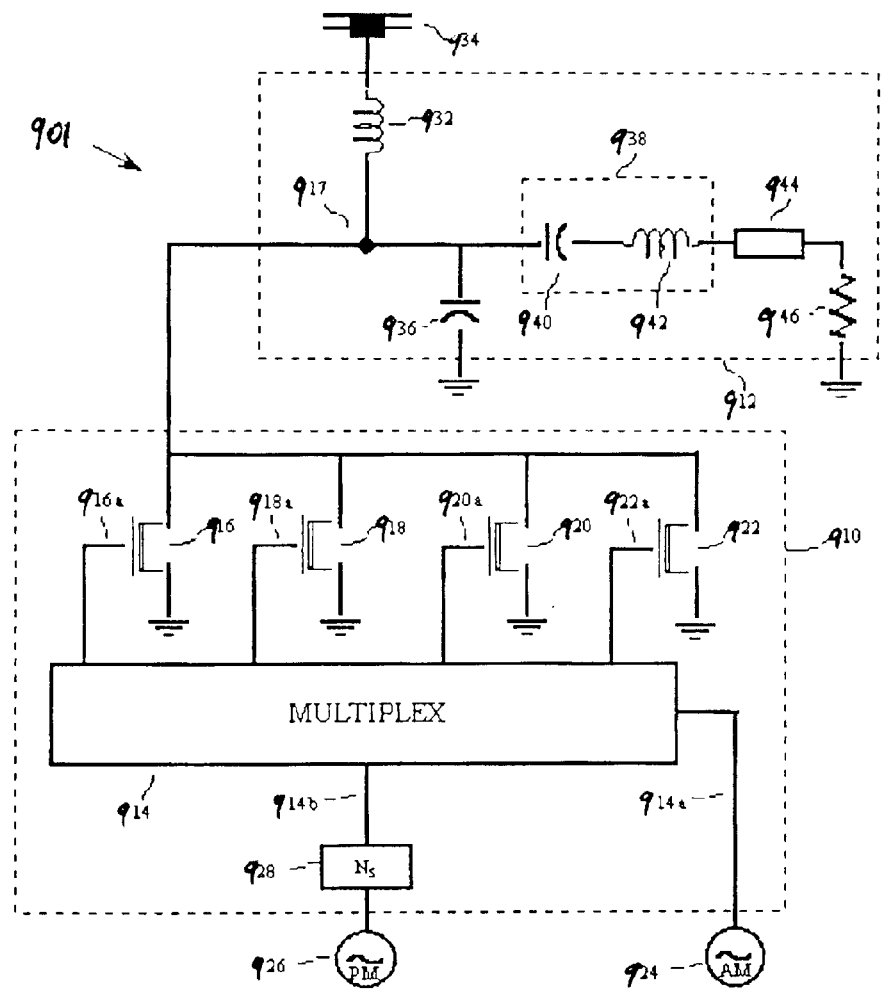
FIG. 9 is another alternative embodiment showing a multiplexed input.

In another input modulation implementation, a multiplexed input envelope restoration circuit may be utilized as shown in FIG. 9. In particular, FIG. 9 is a diagram of a active device switching circuit 910 combined with an output load matching network 912 to make up an amplifier 901. The circuit 910 preferably includes a control device 914 and a plurality of switching devices 916, 918, 920, and 922, each having a different current resistance, and a control device 914. The control device is preferably a multiplexer, such as that commonly available from Motorola, Inc. The switching devices should be lower minimum "ON" resistance devices with high-speed switching capabilities, one example would be the 2SK2922 LDMOS RF discrete FET transistor manufactured by Hitachi, Inc. (http://www.hitachi.co.jp/Sicd/English/Products/transise.htm). These devices are exemplary only for this embodiment, and a wide variety of other components or structures may be substituted for the components described in accordance with the knowledge of one skilled in the art.

The control device 914 receives amplitude information 924 and phase information 926 from a primary waveform. The phase information 926 and amplitude information 924 are received into inputs 914a and 914b of the control device 914. A matching network 928 is linked to input 914b to provide optimum power transfer from the phase modulated source through the control device 914 to input gates 916a, 918a, 920a, and 922a of the switching devices 916, 918, 920, and 922. The matching network 928 may comprise a number of reactive elements according to known methods. Alternative embodiments may include and/or replace matching network 928 with individual matching networks following the control device 914 for further optimization of the input matching for these different-sized switching devices 916, 918, 920, and 922.

The control device 914 uses the amplitude information 924 to select an active switching device from the plurality of switching devices 916, 918, 920, and 922. The switching devices 916, 918, 920, and 922 are controlled by the control device 914 via inputs 916a, 918a, 920a, and 922a. After selecting an active switching device, the control device 914 uses the phase information 926 to control the active switching device to create a secondary waveform for input to the amplifier load network 912 at node 917.

During operation, the control device 914 controls the active switching devices in accordance with the phase information 926. The control device 914 preferably turns the active switching device off and on in response to the phase information 926. As a result, the switch voltage varies between zero and the peak switch voltage of the active switching device.

Because the switching devices 916, 918, 920, and 922 each have a different "ON" resistance, they each exhibit a different peak switching voltage when activated. The control device 914 selects an active switching device in accordance with the amplitude information 924 to achieve a desired peak switch voltage. By selecting an appropriate active switching device for a given time period, the peak amplitude of the switch voltage may be varied to produce a quantized approximation of the amplitude envelope of the primary waveform. As the voltage across the active switching device varies in response to the phase information 926, it is limited to the peak switch voltage of the particular active switching device selected in accordance with the amplitude information 924. Preferably, the amplitude information 924 and phase information 926 are used to create a secondary waveform that approximates the primary waveform. The secondary waveform is then provided as input to the 912 matching network of the amplifier 901.

C. Use Of High Dielectrics for Quarter Wave Delay and Transmission Lines

Other implementations are also contemplated. For example, high dielectric materials may be used to shrink the combiner network in the above embodiment. The effective electrical length is a function of the relative dielectric permittivity of the material on which the microstrip transmission line is fabricated. The electrical length depends on the inverse square root of εr. Building the transmission lines for 1 GHz operation on FR4 standard PCB material with a relative dielectric constant of 4 will mean that each quarter wave line will be approximately 1.48 inches in length. This would shrink to approximately 0.33 inches by using a high dielectric material with relative permeability of approximately 80. The use of a hybrid module assembly employing high dielectric material could be implemented to significantly decrease the size of the solution.

D. Use Of Stepped DC Supply Voltage

In another alternative, the DC control voltage may be modified to achieve peak efficiency at lower discrete power states. An additional aspect of the class E amplifiers used in this scheme is that they retain their efficiency for a given load network better than all other topologies as the DC supply voltage is dropped. This is caused by the variation in output impedance as the supply decreases, and degradation in the output match for the power amplifier. In the class E configuration, wide tolerance on the exact capacitance value induces some variation in AM/PM characteristics, but does not significantly affect the efficiency. Thus, the DC supply voltage may be controlled in fixed increments so that the DC level can control the absolute average power level, keeping the phase drive and envelope modulation the same for the input drive. As with the previous embodiments, the variation in the AM/PM with DC supply voltage will require some phase predistortion, but the efficiency is maintained at peak levels down to very low powers.

Of course, it should be understood that a wide range of changes and modifications can be made to the preferred embodiments described above. For example, different technologies can be used for the switching device shown in the circuits of the preferred embodiments above to exploit the capabilities and different functionality of each component. Such substitutions, taking into account the performance trade-offs of using either the upper or lower switch for modulating the envelope will be different for each case.

Thus, it is intended that the foregoing detailed description be regarded as illustrative rather than limiting, and that it be understood that it is the following claims, including all equivalents, which are intended to define the scope of this invention.

What is claimed is:

1. An amplifier circuit comprising:
   a digital signal processor for producing separated amplitude and phase modulated waveforms; and
   a plurality of class E amplifiers in communication with said digital signal processor, each of said amplifiers having an input for receiving signals corresponding to said waveforms, and outputs linked to a shared load network.

2. The amplifier circuit of claim 1 wherein said circuit is configured to allow one of said amplifiers to saturate prior to saturation of others of said amplifiers.

3. The amplifier circuit of claim 1 wherein at least two of said amplifiers have different output power ratings.

4. The amplifier circuit of claim 1 wherein said plurality of class E amplifiers further comprises a first and a second amplifier, said first amplifier functioning as a carrier amplifier receiving a first amplitude-modulated baseband signal from said digital signal processor, said second amplifier receiving a second amplitude-modulated baseband signal from said digital signal processor.

5. The amplifier circuit of claim 1 wherein each of said class E amplifiers is configured to utilize an envelope signal to adjust its individual output power level.

6. The amplifier circuit of claim 2 further comprising a plurality of digital to analog converters in communication with said digital signal processor, said converters for converting said signals to high-resolution analog signals for input to said amplifiers.

7. The amplifier circuit of claim 2 further comprising at least one modulating upconverter linked to said digital signal processor for modulating said waveforms.

8. The amplifier circuit of claim 5 further comprising at least one bandpass noise filter linked to said upconverter.

9. The amplifier circuit of claim 6 further comprising an impedance adjusting element linked to said peaking amplifier.

10. The circuit of claim 5 further comprising:
    a control device for at least one of said amplifiers for receiving amplitude information or phase information from a primary waveform, and
    a plurality of switching devices in communication with said control device and said at least one amplifier, said switching devices each having a different current resistance;
    wherein said control device uses said information to select an active switching device to create a secondary waveform for input to the matching network of said at least one amplifier.

11. The circuit of claim 10 wherein said switching devices are transistors each having a gate, and said control device controls said switching devices by providing said information at the gate of said switching device.

12. The circuit of claim 1 further comprising:
    a feedback loop for sensing VSWR reflection from an antenna in communication with one of said amplifiers, said feedback loop in communication with said digital signal processor;
    wherein said digital signal processor adjusts said waveforms to correct for said VSWR reflection.

13. An amplifier circuit comprising:
    a digital signal processor producing a plurality of digital amplitude modulation signals and at least one digital phase modulated signal;
    a plurality of digital to analog converters in communication with said digital signal processor for converting said digital amplitude modulation signals into analog amplitude modulation signals, and for converting said digital phase modulated signal into an analog phase modulated signal;
    a plurality of class E amplifiers in communication with said digital to analog converters to receive said analog signals, at least one of said amplifiers functioning as a carrier amplifier connected to receive said analog phase modulated signal and one of said analog amplitude modulation signals, and at least another of said amplifiers functioning as a peaking amplifier connected to receive said analog phase modulated signal and another of said analog amplitude modulation signals.

14. The amplifier circuit of claim 12 further comprising at least one modulating upconverter linked to said digital signal processor for modulating said RF signal.

15. The amplifier circuit of claim 14 further comprising at least one bandpass noise filter linked to said upconverter.

16. The amplifier circuit of claim 13 further comprising an impedance adjusting element linked to said amplifiers.

17. The circuit of claim 13, wherein said class E amplifiers each include envelope adjustment circuitry to adjust the power level for each amplifier in said circuit.

18. The amplifier circuit of claim 13 wherein at least two of said amplifiers have different output power ratings.

19. The circuit of claim 13, wherein said converters are capable of processing at a high bit rate to output high-resolution analog signals corresponding to the signals received from the digital signal processor.

20. The circuit of claim 13, wherein said digital signal processor includes: two amplitude-modulated outputs linked via separate digital to analog converters to each of two of said amplifiers; and a quadrature modulating upconverter and a bandpass filter in series communication with each of said phase-modulated outputs of said digital signal processor.

21. The circuit of claim 13 further comprising means for modulating the input to at least one of said amplifiers.

22. The circuit of claim 13 further comprising:

a feedback loop for sensing VSWR reflection from an antenna in communication with one of said amplifiers, said feedback loop in communication with said digital signal processor;

wherein said digital signal processor adjusts said waveforms to correct for said VSWR reflection.

23. A method of providing high-efficiency and high peak-to-average signal amplification, said method comprising the steps of:

providing first and second digital amplitude waveforms from a digital signal processor;

providing a first digital phase waveform from said digital signal processor;

converting said first digital amplitude waveform into a first analog amplitude waveform, and said second digital amplitude waveform into a second analog amplitude waveform;

converting said first digital phase waveform into a first analog phase waveform;

generating a first output signal with a carder amplifier from said first analog amplitude waveform and said first analog phase waveform;

generating a second output signal with a peaking amplifier from said second analog amplitude waveform and said second analog phase waveform; and combining said first and second output signals.

24. The method of claim 23 further comprising the steps of:

sensing VSWR reflection from an antenna in communication with one of said amplifiers; and adjusting said digital amplitude and phase waveforms within said processor to correct for said VSWR reflection.

* * * * *